(12) United States Patent
Rajavi et al.

(10) Patent No.: US 8,736,329 B1
(45) Date of Patent: May 27, 2014

(54) SYSTEMS AND METHODS FOR PROVIDING DUTY CYCLE CORRECTION

(71) Applicant: QUALCOMM Incorporated, San Diego, CA (US)

(72) Inventors: Yashar Rajavi, Mountain View, CA (US); Shahram Abdollahi-Alibeik, Los Gatos, CA (US); Hakan Dogan, El Cerrito, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/760,896

(22) Filed: Feb. 6, 2013

(51) Int. Cl.
   *H03K 3/017* (2006.01)
(52) U.S. Cl.
   USPC ............. 327/172; 327/35; 327/175; 327/176
(58) Field of Classification Search
   CPC .......... H03K 7/08; H03K 3/26; H03K 3/017; H03K 3/284; H03K 5/1565; H03K 5/13; H03K 9/08; H03K 5/10; H03L 7/0812; H04N 5/10; G01R 29/0273; G01R 29/02; G01R 19/0038; G01R 23/15
   USPC ................................. 327/31, 35–36, 172–176
   See application file for complete search history.

(56) References Cited

U.S. PATENT DOCUMENTS

| 5,430,394 A | 7/1995 | McMinn et al. |
| 7,310,010 B2 | 12/2007 | Minzoni et al. |
| 7,733,143 B2 | 6/2010 | Guo et al. |
| 7,898,309 B1 | 3/2011 | Dogan |
| 7,994,834 B2 | 8/2011 | Ku |

FOREIGN PATENT DOCUMENTS

JP          04078219 A        3/1992

*Primary Examiner* — An Luu
(74) *Attorney, Agent, or Firm* — Bay Area Technology Law Group PC

(57) ABSTRACT

Systems and methods are disclosed including a duty cycle module having two timer circuits to measure pulse widths of a clock signal. Two comparators are used to generate control signals depending upon comparisons of the pulse width measurements. In response to the control signals, either the clock signal or an inverted clock signal may be programmably delayed such that combination of the clock signal and the inverted clock signal results in a corrected clock signal. Systems and methods are also disclosed for verifying operation of a duty cycle module.

27 Claims, 6 Drawing Sheets

SYSTEMS AND METHODS FOR PROVIDING DUTY CYCLE CORRECTION

FIELD OF THE PRESENT INVENTION

This disclosure generally relates to clock signals and more specifically to the duty cycle correction of clock signals.

BACKGROUND OF THE INVENTION

Digital semiconductor circuits may employ a clock signal to help coordinate operation of flip-flops, logic gates and other elements. Typically a clock signal having a square wave may be used. Further, it is generally desirable for the clock signal to exhibit a duty cycle of 50% such that the high and low signals are generated for equal periods of time. Generally, this characteristic helps prevent metastability, sequencing errors, and other timing errors in the digital circuit.

Accordingly, clock signal generators may employ a correction loop to reduce deviations from the desired 50% duty cycle. Conventional techniques for implementing duty cycle correction loops include the use of a resistor-capacitor (RC) circuit to take the average of the high and low values of the clock signal for comparison to one-half the supply voltage. By employing a feedback circuit to drive the difference to zero, a 50% duty cycle may be achieved. Although effective, these approaches typically involve the use of large capacitance and resistance values to average the high and low signals. As a result, the RC circuit may have a relatively slow response time. Further, the techniques may be applied directly only when the duty cycle being corrected is greater than 50%. If the duty cycle is less than 50%, the clock signal is inverted before correction to result in a duty cycle greater than 50% to allow the technique to be applied. Inverting the clock signal may lead to a disruption in the operation of circuits receiving the clock signal, such as phase locked loops (PLLs) and the like.

Accordingly, what have been needed are systems and methods for correcting the duty cycle of a clock signal offering improved response times. There is also a need for techniques for duty cycle correction that reduce disruptions to operation. This disclosure satisfies these and other needs.

SUMMARY OF THE INVENTION

This specification discloses systems for correcting the duty cycle of a clock signal. In one aspect, such systems may include a duty cycle module having a first programmable delay to receive an input clock signal and output a first delayed clock signal, an inverter to receive the input clock signal and output an inverted clock signal, a second programmable delay to receive the inverted clock signal and output a second delayed clock signal, a latch to combine the first delayed clock signal and the second delayed clock signal and generate a corrected clock signal, a first timing circuit to measure a first pulse width of the corrected clock signal and output a first measurement, a second timing circuit to measure a second pulse width of the corrected clock signal and output a second measurement, a first comparator to output an UP control signal if the first measurement is greater than the second measurement at a desired time, a second comparator to output a DOWN control signal if the second measurement is greater than the first measurement at the desired time, and a duty cycle controller to receive at least one of the UP control signal and the DOWN control signal and adjust a setting of one of the first programmable delay and the second programmable delay based on the received at least one control signal in order to adjust a duty cycle of the corrected clock signal. The corrected clock signal may be adjusted to have a duty cycle of approximately 50%. The first timing circuit may initiate a charging cycle of a first capacitor at a time corresponding to the rising edge of the third clock signal and the second timing circuit may initiate a charging cycle of a second capacitor at a time corresponding to the rising edge of the third clock signal. Further, the second timing circuit may delay the charging cycle of the second capacitor for a predetermined time. Additionally, the first and second timing circuits may be resistance and capacitance networks having a time constant wherein one of the first capacitor and the second capacitor is in a charging state and the other of the first capacitor and the second capacitor is in a steady state at the desired time when the duty cycle of the third clock signal is not 50%.

In one aspect, the duty cycle controller may cause the first comparator to output the UP signal and to cause the second comparator to output the DOWN signal at the desired time.

In another aspect, the duty cycle controller may adjust the setting of one of the first programmable delay and the second programmable delay from a current setting by a unit delay amount.

Yet another aspect includes a duty cycle module that also includes a test module to selectively override the duty cycle controller to apply a predetermined delay adjustment to one of the first programmable delay and the second programmable delay.

In one embodiment, a duty cycle module may include a first programmable delay to delay an input clock signal and output a first delayed signal, a second programmable delay to delay an inverted input clock signal and output a second delayed signal, a latch to combine the first delayed clock signal and the second delayed clock signal and generate a corrected clock signal having a duty cycle, a duty cycle controller to receive information regarding characteristics of the duty cycle of the corrected clock signal and to adjust settings of the first programmable delay and the second programmable delay based on the information, and a test module to selectively override the duty cycle controller to apply a predetermined delay setting to one of the first programmable delay and the second programmable delay This disclosure also includes methods for correcting the duty cycle of a clock signal. For example, one method includes receiving a first clock signal having a rising edge as an input, inverting the first clock signal to generate a second clock signal having a rising edge, combining the first and second clock signals to generate a third clock signal having a rising edge corresponding to the rising edge of the first clock signal, a falling edge corresponding to the rising edge of the second clock signal and a duty cycle, generating a first timing signal corresponding to a first pulse width of the third clock signal, generating a second timing signal corresponding to a second pulse width of the third clock signal, generating a first control signal if the first timing signal is greater than the second timing signal at a first time, generating a second control signal indicating if the second timing signal is greater than the first timing signal at the first time, and correcting the duty cycle of the third clock signal by imparting a relative delay to one of the first clock signal and second clock signals based on at least one of the first and second control signals. Imparting a relative delay may include adjusting the duty cycle of the third clock signal to approximately 50%.

As desired, generating the first timing signal may include initiating a charging cycle of a first capacitor at a time corresponding to the rising edge of the third clock signal and generating the second timing signal may include initiating a charging cycle of a second capacitor at a time corresponding to the falling edge of the third clock signal. Further, generating the second timing signal may also include delaying the initiation of the charging cycle of the second capacitor by a predetermined amount.

In one aspect, imparting the relative delay to one of the first and second clock signals comprises applying a control setting to programmable delays through which the first and second clock signals are fed. This may also include adjusting a current setting by a unit delay of the programmable delays.

This disclosure also includes a method for verifying operation of a duty cycle module including the steps of providing a duty cycle module including a first programmable delay to delay an input clock signal, a second programmable delay to delay an inverted input clock signal, and a duty cycle controller, wherein outputs of the first programmable delay and the second programmable delay are combined to generate a corrected clock signal having a duty cycle and wherein the duty cycle controller receives information regarding characteristics of the duty cycle of the corrected clock signal and adjusts settings of the first programmable delay and the second programmable delay based on the information, inputting a reference clock signal having a duty cycle of 50% as the input clock signal, selectively overriding the duty cycle controller to apply a predetermined delay setting to one of the first programmable delay and the second programmable delay, operating the duty cycle correction module to adjust the other programmable delay line until the corrected clock signal has an approximately 50% duty cycle, and verifying operation of the duty cycle module when the predetermined delay setting applied to one of the first programmable delay and the second programmable delay corresponds to a setting for the other of the first programmable delay and the second programmable delay determined by the duty cycle controller. Further, the method may also include measuring the duty cycle of the corrected clock signal and verifying operation of the duty cycle module when the measured duty cycle is approximately 50%. In one embodiment, the steps of overriding of the duty cycle, operating of the duty cycle module and verifying operation of the duty cycle module may be performed at a plurality of predetermined delay settings. These may include applying predetermined delay settings to each of the first programmable delay and the second programmable delay.

This disclosure may also include a duty cycle module having means for delaying an input clock signal to output a first delayed signal, means for delaying an inverted signal of the input clock signal to output a second delayed signal, means for combining the first delayed signal and the second delayed signal to generate a corrected clock signal, a first timing means coupled to the corrected clock signal for measuring a first pulse width of the corrected clock signal and outputting a first measurement, a second timing means coupled to the corrected clock signal for measuring a second pulse width of the corrected clock signal and outputting a second measurement, a first comparator means, coupled to the first timing means and the second timing means, for outputting an UP control signal if the first measurement is greater than the second measurement at a desired time, a second comparator means, coupled to the first timing means and the second timing means, for outputting a DOWN control signal if the second measurement is greater than the first measurement at the desired time, and means for adjusting a setting of at least one of the means for delaying the input clock signal and the means for delaying the inverted signal based on at least one of the UP control signal and the DOWN control signal to adjust a duty cycle of the corrected clock signal. As desired, the means for adjusting a setting of at least one of the means for delaying the input clock signal and the means for delaying the inverted signal may adjust the duty cycle to approximately 50%.

In one aspect, the first timing means may initiate a measuring cycle at a time corresponding to a rising edge of the corrected clock signal. Further, the second timing means may initiate a measuring cycle at a time corresponding to a falling edge of the corrected clock signal. In addition, the second timing means may delay initiation of the measuring cycle by a predetermined amount.

In another aspect, the means for adjusting a setting of at least one of the means for delaying the input clock signal and the means for delaying the inverted signal may perform the adjustment by a unit delay.

BRIEF DESCRIPTION OF THE DRAWINGS

Further features and advantages will become apparent from the following and more particular description of the preferred embodiments of the invention, as illustrated in the accompanying drawings, and in which like referenced characters generally refer to the same parts or elements throughout the views, and in which.

DETAILED DESCRIPTION OF THE INVENTION

Figure 1:
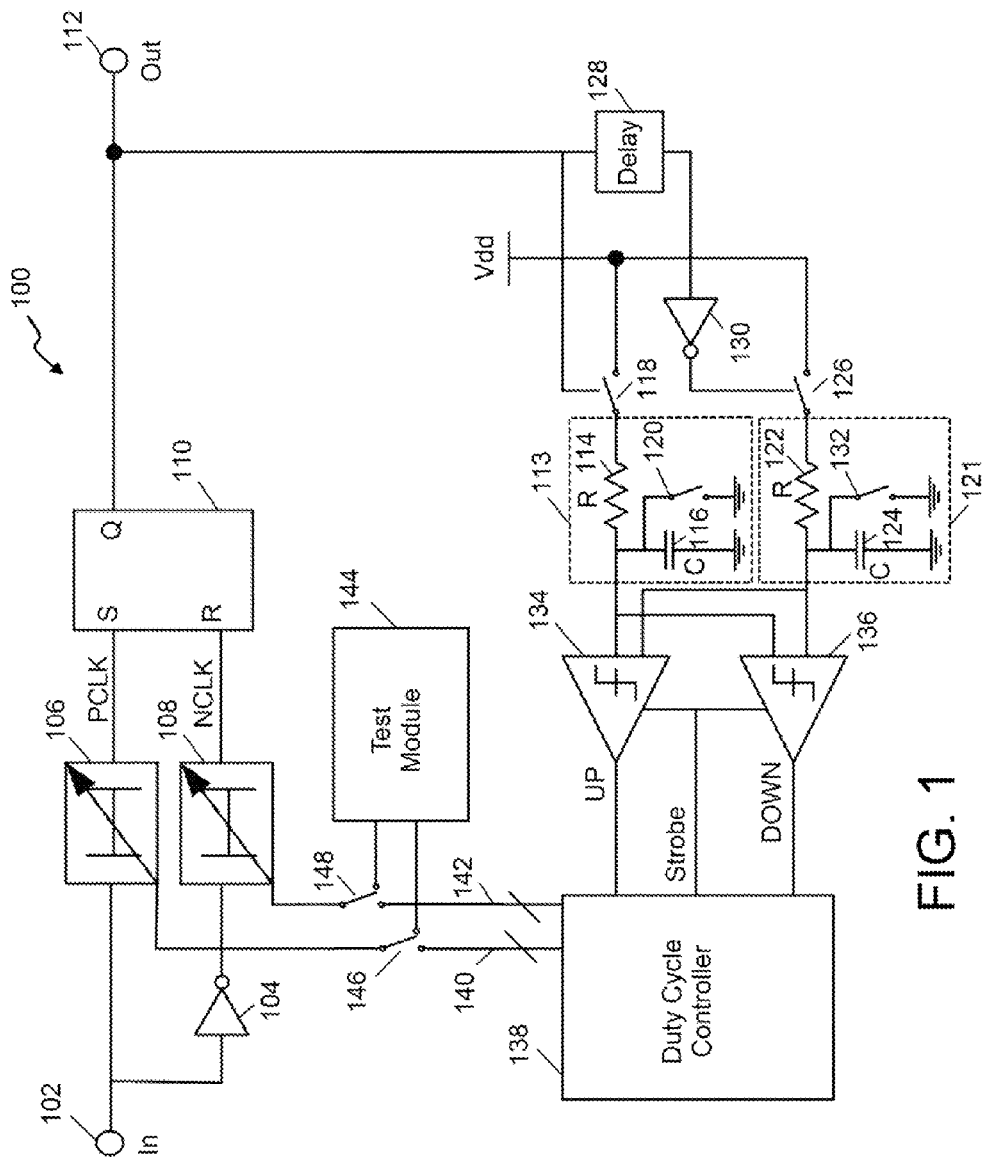
FIG. 1 depicts a duty cycle module, according to an embodiment of the invention.

At the outset, it is to be understood that this disclosure is not limited to particularly exemplified materials, architectures, routines, methods or structures as such may, of course, vary. Thus, although a number of such options, similar or equivalent to those described herein, can be used in the practice or embodiments of this disclosure, the preferred materials and methods are described herein.

It is also to be understood that the terminology used herein is for the purpose of describing particular embodiments of this disclosure only and is not intended to be limiting.

The detailed description set forth below in connection with the appended drawings is intended as a description of exemplary embodiments of the present invention and is not intended to represent the only exemplary embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the specification. It will be apparent to those skilled in the art that the exemplary embodiments of the specification may be practiced without these specific details. In some instances, well known structures and devices are shown in block diagram form in order to avoid obscuring the novelty of the exemplary embodiments presented herein.

For purposes of convenience and clarity only, directional terms, such as top, bottom, left, right, up, down, over, above, below, beneath, rear, back, and front, may be used with respect to the accompanying drawings or chip embodiments. These and similar directional terms should not be construed to limit the scope of the invention in any manner.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present.

The terms second level and first level, high and low and 1 and 0, as used in the following description may be used to describe various logic states as known in the art. Particular voltage values of the second and first levels are defined arbitrarily with regard to individual circuits. Furthermore, the voltage values of the second and first levels may be defined differently for individual signals such as a clock and a digital data signal. Although specific circuitry has been set forth, it will be appreciated by those skilled in the art that not all of the disclosed circuitry is required to practice the invention. Moreover, certain well known circuits have not been described, to maintain focus on the invention. Similarly, although the description refers to logical "0" and logical "1" or low and high in certain locations, one skilled in the art appreciates that the logical values can be switched, with the remainder of the circuit adjusted accordingly, without affecting operation of the present invention.

Some portions of the detailed descriptions which follow are presented in terms of procedures, logic blocks, processing and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing the terms such as "accessing," "receiving," "sending," "using," "selecting," "determining," "normalizing," "multiplying," "averaging," "monitoring," "comparing," "applying," "updating," "measuring," "deriving" or the like, refer to the actions and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments described herein may be discussed in the general context of processor-executable instructions residing on some form of processor-readable medium, such as program modules, executed by one or more computers or other devices. Generally, program modules include routines, programs, objects, components, data structures, etc., that perform particular tasks or implement particular abstract data types. The functionality of the program modules may be combined or distributed as desired in various embodiments.

In the figures, a single block may be described as performing a function or functions; however, in actual practice, the function or functions performed by that block may be performed in a single component or across multiple components, and/or may be performed using hardware, using software, or using a combination of hardware and software. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention. Also, the exemplary wireless communications devices may include components other than those shown, including well-known components such as a processor, memory and the like.

The techniques described herein may be implemented in hardware, software, firmware, or any combination thereof, unless specifically described as being implemented in a specific manner. Any features described as modules or components may also be implemented together in an integrated logic device or separately as discrete but interoperable logic devices. If implemented in software, the techniques may be realized at least in part by a non-transitory processor-readable storage medium comprising instructions that, when executed, performs one or more of the methods described above. The non-transitory processor-readable data storage medium may form part of a computer program product, which may include packaging materials.

The non-transitory processor-readable storage medium may comprise random access memory (RAM) such as synchronous dynamic random access memory (SDRAM), read only memory (ROM), non-volatile random access memory (NVRAM), electrically erasable programmable read-only memory (EEPROM), FLASH memory, other known storage media, and the like. The techniques additionally, or alternatively, may be realized at least in part by a processor-readable communication medium that carries or communicates code in the form of instructions or data structures and that can be accessed, read, and/or executed by a computer or other processor.

The various illustrative logical blocks, modules, circuits and instructions described in connection with the embodiments disclosed herein may be executed by one or more processors, such as one or more digital signal processors (DSPs), general purpose microprocessors, application specific integrated circuits (ASICs), application specific instruction set processors (ASIPs), field programmable gate arrays (FPGAs), or other equivalent integrated or discrete logic circuitry. The term "processor," as used herein may refer to any of the foregoing structure or any other structure suitable for implementation of the techniques described herein. In addition, in some aspects, the functionality described herein may be provided within dedicated software modules or hardware modules configured as described herein. Also, the techniques could be fully implemented in one or more circuits or logic elements. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

For purposes of convenience and clarity only, directional terms, such as top, bottom, left, right, up, down, over, above, below, beneath, rear, back, and front, may be used with respect to the accompanying drawings or particular embodiments. These and similar directional terms should not be construed to limit the scope of the invention in any manner and may change depending upon context. Further, sequential terms such as first and second may be used to distinguish similar elements, but may be used in other orders or may change also depending upon context.

Unless defined otherwise, all technical and scientific terms used herein have the same meaning as commonly understood by one having ordinary skill in the art to which the disclosure pertains.

Finally, as used in this specification and the appended claims, the singular forms "a, "an" and "the" include plural referents unless the content clearly dictates otherwise.

As will be described below, the systems and methods of this disclosure include a duty cycle correction module having two timer circuits to measure the time duration of the logical high and the logical low portions of a clock signal. Two comparators are used to generate control signals depending upon whether the duration of the high portion exceeds the low portion or the low portion exceeds the high portion. In response to the control signals, either the clock signal or an inverted clock signal may be programmably delayed such that combination of the signals results in a corrected clock signal.

To help illustrate these and other aspects of the disclosure, FIG. 1 depicts duty cycle module 100 that may be configured to receive an input clock signal and output a corrected clock signal having a duty cycle closer to 50%. As shown, duty cycle module 100 receives a clock signal PCLK at input node 102 that may have a duty cycle that varies from the desired 50%. A complementary, inverted clock signal NCLK is generated by inverter 104. PCLK is fed through a first digital programmable delay line, delay 106, and NCLK is fed through a second digital programmable delay line, delay 108. The PCLK is applied as an input at node S and NCLK is applied as an input at node R to a set-reset (SR) latch 110 and combined to output a corrected clock signal CCLK at node Q which is then coupled to output node 112.

Programmable delays 106 and 108 are responsive to feedback generated from CCLK. Two timing circuits may be employed to generate signals that correspond to the pulse width of the high and low portions of CCLK as follows. A first timing circuit 113 is formed by an resistor-capacitor (RC) charge/discharge network using resistor (R) 114 and capacitor (C) 116. Switch 118 may be triggered by a rising edge of CCLK, coupling C 116 to supply voltage Vdd to initiate a charging cycle. Since the charging cycle is initiated by the rising edge of CCLK, the voltage across C 116 may represent the high pulse width of CCLK. C 116 may be discharged by being coupled to ground through switch 120, causing timing circuit 113 to reset. Similarly, a second timing circuit 121 including R 122 and C 124 may be coupled to Vdd by switch 126. As shown, switch 126 may be controlled by a clock signal generated by feeding CCLK through a fixed delay line, delay 128, and inverter 130, creating an offset signal OCCLK that is complementary to CCLK. Therefore, switch 126 may be triggered by a rising edge of OCCLK so that the voltage developed across C 124 may represent the high pulse width of OCCLK, which is equivalent to the low pulse width of CCLK. C 124 may be coupled to ground through switch 132 to reset timing circuit 121.

Further, two comparators may be configured to receive the voltage signals generated by C 116 and C 124 as inputs. Comparator 134 is coupled to C 116 and C 124 and outputs a control signal, UP. In one aspect, comparator 134 may be configured to output a logical high signal when the voltage across C 116 is greater than the voltage across C 124. Comparator 136 is also coupled to C 116 and C 124 and outputs a control signal, DOWN. In one aspect, comparator 136 may be configured to output a logical high signal when the voltage across C 124 is greater than the voltage across C 116. The outputs from comparators 134 and 136 are fed to duty cycle controller 138, which may be implemented as a state machine or with any other suitable equivalent. In this embodiment, duty cycle controller 138 may be configured to interpret a logical high UP signal from comparator 134 as an indication that the duty cycle of CLK has a duty cycle less than 50% and to interpret a logical high DOWN signal from comparator 136 as an indication that the duty cycle of CLK has a duty cycle greater than 50%. Further, duty cycle controller 138 may output a strobe signal to comparator 134 and comparator 136 to trigger operation at a desired time. Overall sensitivity of duty cycle module 100 may be established, at least in part, by suitable configuration of the tolerance of comparators 134 and 136. By adjusting the tolerance of comparators 134 and 136, both UP and DOWN signals may have a logical low value when the CLK duty cycle is within a desired range of 50%.

In response to the UP signal and DOWN signal and a current state, duty cycle controller 138 may be configured to adjust programmable delay 106 and programmable delay 108 to generate selectively delayed PCLK and NCLK signals such that combination by SR latch 110 generates CCLK having a duty cycle closer to 50%. Duty cycle controller supplies control words comprising an appropriate number of bits to programmable delay 106 over control line 146 and to programmable delay 108 over control line 148. In one embodiment, programmable delays 106 and 108 may exhibit a tuning range of 5 bits.

In a first aspect, duty cycle controller 138 may be configured to respond to a logical high UP signal by generating a control word for programmable delay 108 that represents an increased delay relative to the current setting or by generating a control word for programmable delay 106 that represents a decreased delay relative to the current setting. Similarly, in response to a logical high DOWN signal, duty cycle controller 138 may generate a control word for programmable delay 106 that represents an increased delay relative to the current setting or may generate a control word for programmable delay 108 that represents a decreased delay relative to the current setting. In one embodiment, the increment of each increase or decrease may be the effective unit delay resolution provided by programmable delays 106 and 108 and may correspond to the least significant bit (LSB) of the control words.

Figure 2:
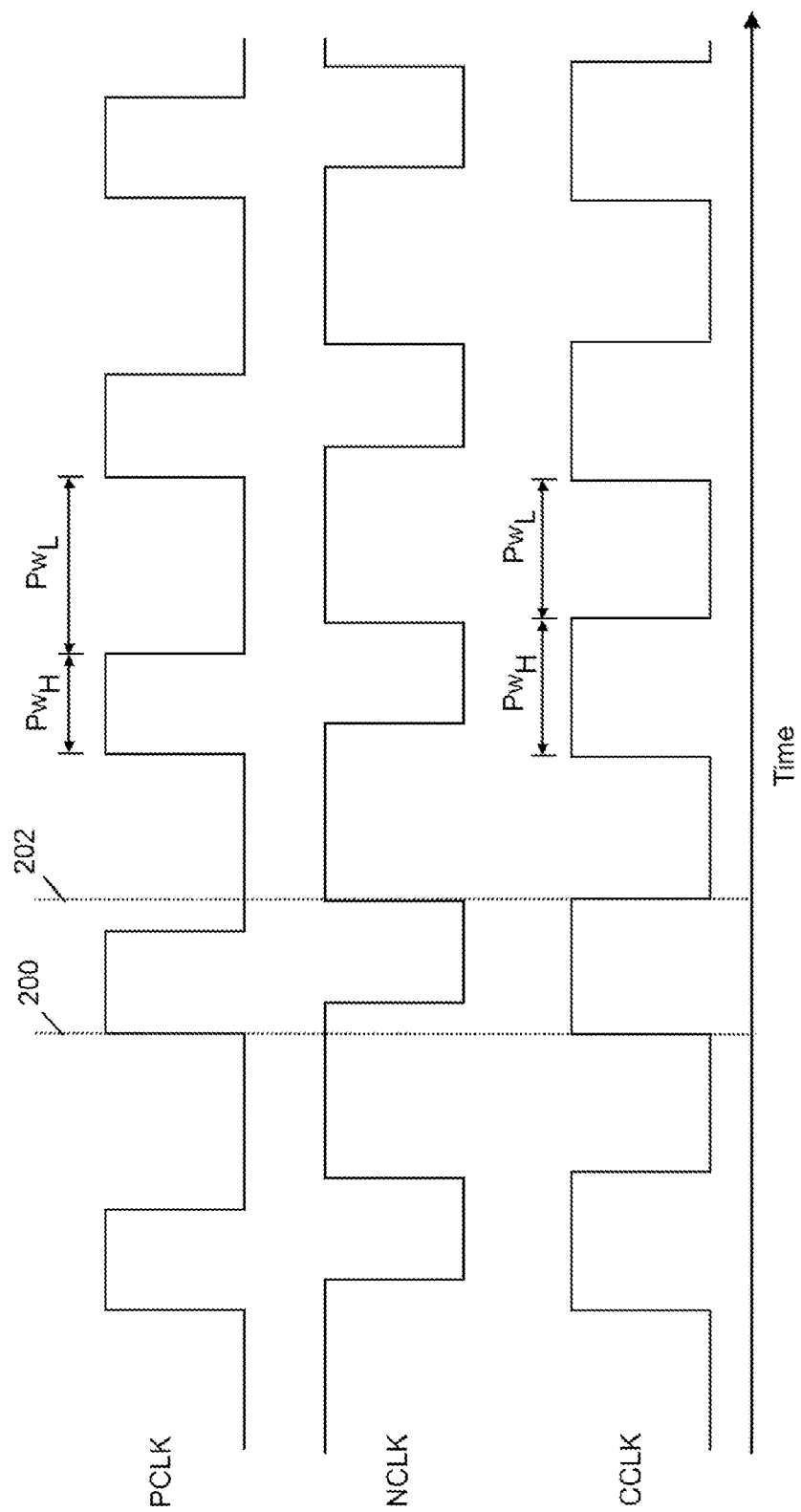
FIG. 2 represents the combination of a programmably delayed clock signal and a programmably delayed inverted clock signal to generate a corrected clock signal, according to an embodiment of the invention.

To help illustrate the operation of SR latch 110, one example of the combination of programmably delayed PCLK and NCLK to generate CCLK is depicted in FIG. 2. As shown, PCLK as input to duty cycle module 100 may be approximately a square wave having a duty cycle as defined by the ratio of the pulse width of the high portion of the wave to the period of the signal. In this example, PCLK exhibits a duty cycle less than 50%, such that the pulse width of the high portion, $Pw_H$, is less than the pulse width of the low portion, Pw$_L$. Correspondingly, programmable delay 108 may delay NCLK so that the rising edges are advanced relative to the falling edges of PCLK. SR latch 110 may be configured to output CCLK having rising edges that correspond to the rising edges of PCLK as indicated by time line 200 and having falling edges that correspond to the rising edges of NCLK as indicated by time line 202. As a result, CCLK may exhibit a duty cycle of approximately 50% such that the Pw$_H$ is approximately equal to Pw$_L$. Although not depicted, operation of duty cycle module 100 when PCLK has a duty cycle greater than 50% is similar. Timing circuits 113 and 121 may be sampled at a time approaching the rising edge of CCLK and voltage across C 116 may exceed voltage across C 124 in this state. Accordingly, comparator 132 may output UP signal at logical low, comparator 134 may output DOWN signal at logical high. Duty cycle controller 138, in response to these inputs, may adjust programmable delays 106 and 108 to delay PCLK relative to NCLK, resulting in CCLK having a duty cycle closer to 50%.

Figure 3:
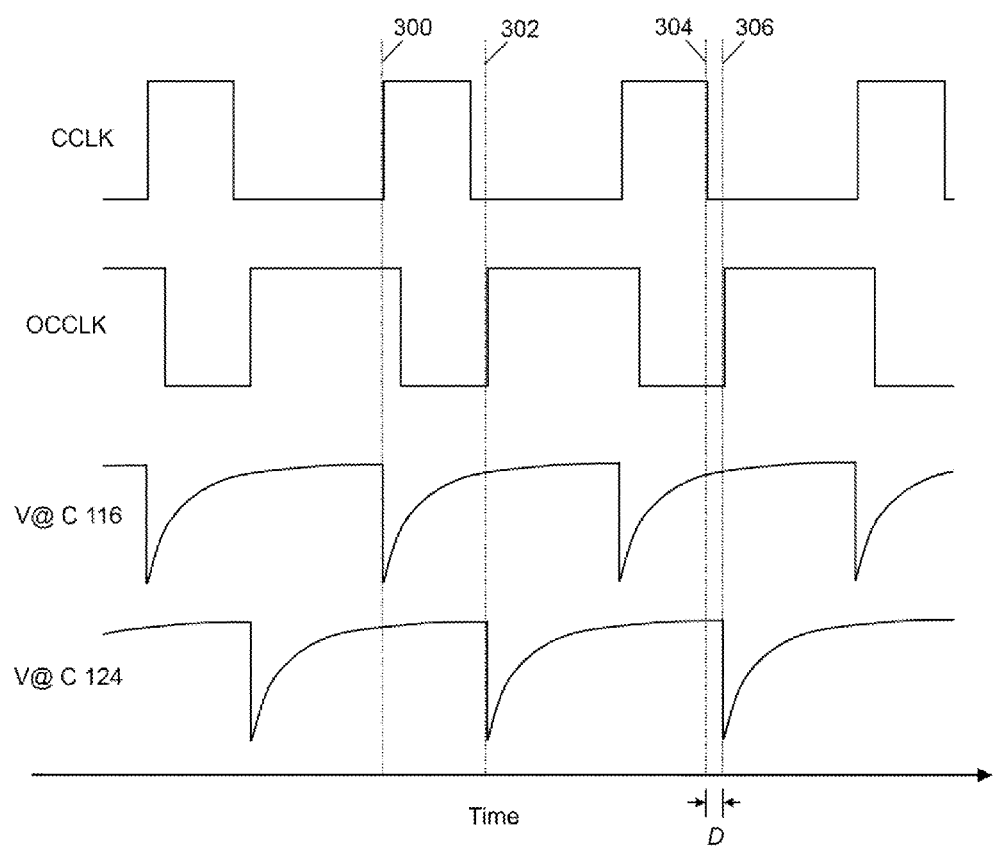
FIG. 3 schematically depicts the operation of a duty cycle module at a duty cycle of less than 50%, according to an embodiment of the invention.
Figure 4:
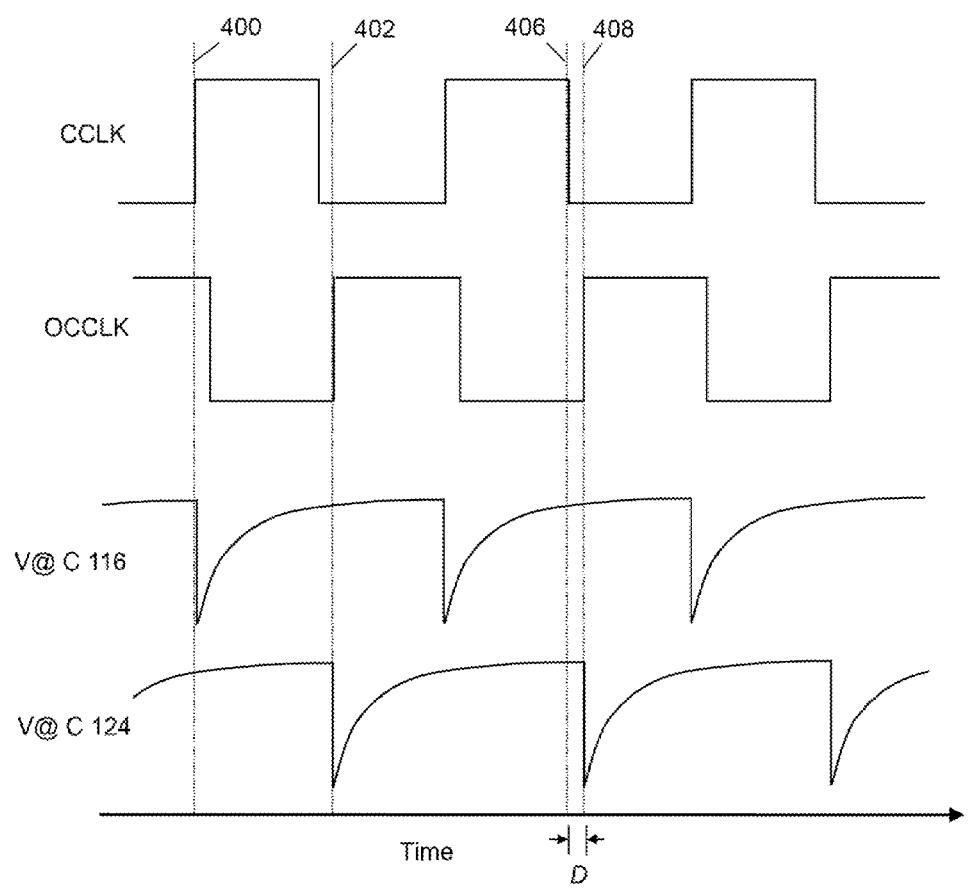
FIG. 4 schematically depicts the operation of a duty cycle module at a duty cycle of approximately 50%, according to an embodiment of the invention.

In another aspect, an exemplary illustration of the operation of timing circuits 113 and 121 to provide signals representing the pulse width of the high and low portions of CCLK is depicted in FIGS. 3 and 4. First, FIG. 3 represents an example of the signals generated by timing circuits 113 and 121 with respect to a CCLK signal output by SR latch 110 before duty cycle controller 138 has determined the appropriate delays to apply via programmable delays 106 and 108. This condition may exist during an initial powering on of duty cycle module 100, when the duty cycle of the PCLK as applied to input node 102 changes during operation, or during iterative operation of duty cycle module 100 as programmable delays 106 and 108 are sequentially adjusted to settings determined to result in a CCLK having a duty cycle closer to 50%. Thus, CCLK in this exemplary state of operation exhibits a duty cycle less than 50% as shown, such that the pulse width of the high portions of the wave are less than the pulse width of the low portions. Timing circuit 113 generates a signal corresponding to the voltage across C 116. Initiation of a charging cycle of C 116 is triggered by switch 118 in response to the rising edge of CCLK as indicated by time line 300. Similarly, timing circuit 121 generates a signal corresponding to the voltage across C 124 and a charging cycle of C 124 may be initiated by switch 126 in response to the rising edge of OCLK as indicated by time line 302. As described above, OCCLK is the complement of CCLK that is offset as indicated by the interval having a duration D bounded by a falling edge of CCLK, such as at time line 304, and a rising edge of OCCLK, such as at time line 306. Duration D may be the offset imparted to OCCLK by delay 128 and may be set to a desired value to provide an overlap to facilitate comparison of the timing signals and to influence the accuracy of duty cycle module 100.

In one aspect, duty cycle controller 138 may strobe comparators 132 and 134 at a time approaching the rising edge of OCLK. Accordingly, comparators 132 and 134 may sample the voltage across C 116 and C 124 and generate signals UP and DOWN that are output to duty cycle controller 138 during this interval. Since CCLK has a duty cycle of less than 50% in this example, the voltage across C 116 is sampled at a point in the charging cycle when the voltage is still increasing relatively rapidly and may have a value that is less than the voltage across C 124 at the same time. As described above, comparator 132 may be configured to output UP signal at logical high upon determining that the signal from timing circuit 121 exceeds the signal from timing circuit 113. Further, comparator 134 may be configured to output a DOWN signal at logical low under the same condition. As a result of the UP and DOWN signals, duty cycle controller 138 may then issue appropriate control words over control lines 140 and 142 to cause NCLK to be delayed relative to PCLK, such as by increasing the delay of programmable delay 108 or decreasing the delay of programmable delay 106.

Following sufficient iterations of operation of duty cycle module 100, a CCLK having a desired duty cycle may be generated. FIG. 4 illustrates an example of operation of timing circuits 113 and 121 with respect to a CCLK signal output by SR latch 110 after duty cycle controller 138 has determined the appropriate delays to apply via programmable delays 106 and 108. Thus, CCLK in this subsequent state of operation may exhibit a duty cycle of approximately 50%, such that the pulse width of the high portions of the wave is approximately equal to the pulse width of the low portions. As shown, timing circuit 113 outputs a signal corresponding to the voltage across C 116 over a series of charge and discharge cycles, with the charge cycles initiated by the rising edges of CCLK, such as at time line 400. Similarly, timing circuit 121 outputs a signal corresponding to the voltage across C 124, also over a series of charge and discharge cycles, with the charge cycles initiated by the rising edges of OCCLK, such as at time line 402. Again, the duration D indicated by the falling edge of CCLK at time line 404 and the rising edge of OCCLK at time line 406 corresponds to the offset imparted to OCCLK by delay 128.

As previously described, duty cycle controller 138 may cause comparators 134 and 136 to sample the signal output by timing circuits 113 and 121 by sending a strobe signal at a desired time. In one aspect, comparators 134 and 136 may sample timing circuits 113 and 121 at a time approaching a rising edge of OCCLK, such as at time line 406. Also as described, duty cycle module 100 may determine characteristics of the duty cycle of CCLK by comparing the timing signals. In this example, CCLK has a duty cycle closer to 50%, so that the voltage across C 116 is sampled at a point in the charging cycle when the voltage is increasing relatively less rapidly and may have substantially approached a maximum value. At this stage, the voltage across C 116 may be within a desired threshold of, or may be approximately equal to, the voltage across C 124 at the same time. Similar results may be obtained when timing circuits 113 and 121 are sampled a time approaching the rising edge of CCLK. Under such conditions, comparator 134 may be configured to output the UP signal at logical low and comparator 136 may be configured to output the DOWN signal at logical low. Correspondingly, duty cycle controller 138 may be configured to interpret this condition as an indication that the duty cycle of CCLK is at a desired value and make no adjustments to programmable delays 106 and 108.

In some embodiments, the behavior of duty cycle module 100 may be tailored to the frequency of PCLK. For example, the length of the charging cycles exhibited by timing circuits 113 and 121 may be adjusted to facilitate the comparisons used to determine whether the duty cycle of CCLK is greater or less than 50%. The timing circuits 113 and 121 have a time constant (t) that is the product of the resistance and capacitance of R 114 and C 116 for timing circuit 113 and of R 122 and C 124 for timing circuit 121. For symmetry, the values of R 114 and R122 may be approximately the same and/or the values of C 116 and C 124 may also be approximately the same. During a transient period beginning at the initiation of the charging cycle and extending to approximately 5τ, the voltage across C 116 and C 124 continues to increase as compared to a steady state period that exists following approximately 5τ when C 116 and C 124 may be substantially fully charged. Accordingly, suitable values may be selected for R 114, R 122, C 116 and C 124 so that the transient period is approximately equal to the pulse width of CCLK at a 50% duty cycle. In general, the value of time constant t may be bounded by an upper value that still provides a sufficient difference between the voltages across C 116 and C 124 after a charging cycle and may be bounded by a lower value so that C 116 and C 124 do not fully charge to Vdd. In turn, a signal generated by timing circuits 113 and 121 at a time corresponding to a pulse width of CCLK when the duty cycle is 50% may be sufficiently close to the steady state voltage so that comparator 134 outputs the UP signal at logical low and comparator 136 outputs the DOWN signal at logical low.

Further, the charge/discharge cycles of timing circuits 113 and 121 shown in FIGS. 3 and 4 are idealized representations to help illustrate operation of duty cycle module 100 with respect to the charging portions in particular. As a practical matter, the discharge of C 116 and C 124 may not be substantially instantaneous as shown. Rather, a finite time may be required to discharge timing circuits 113 and 121. To compensate, duty cycle controller 138 may send the strobe signals to comparators 134 and 136 at a rate that allows for discharge, such as every four cycles of PCLK or any other suitable value.

Figure 5:
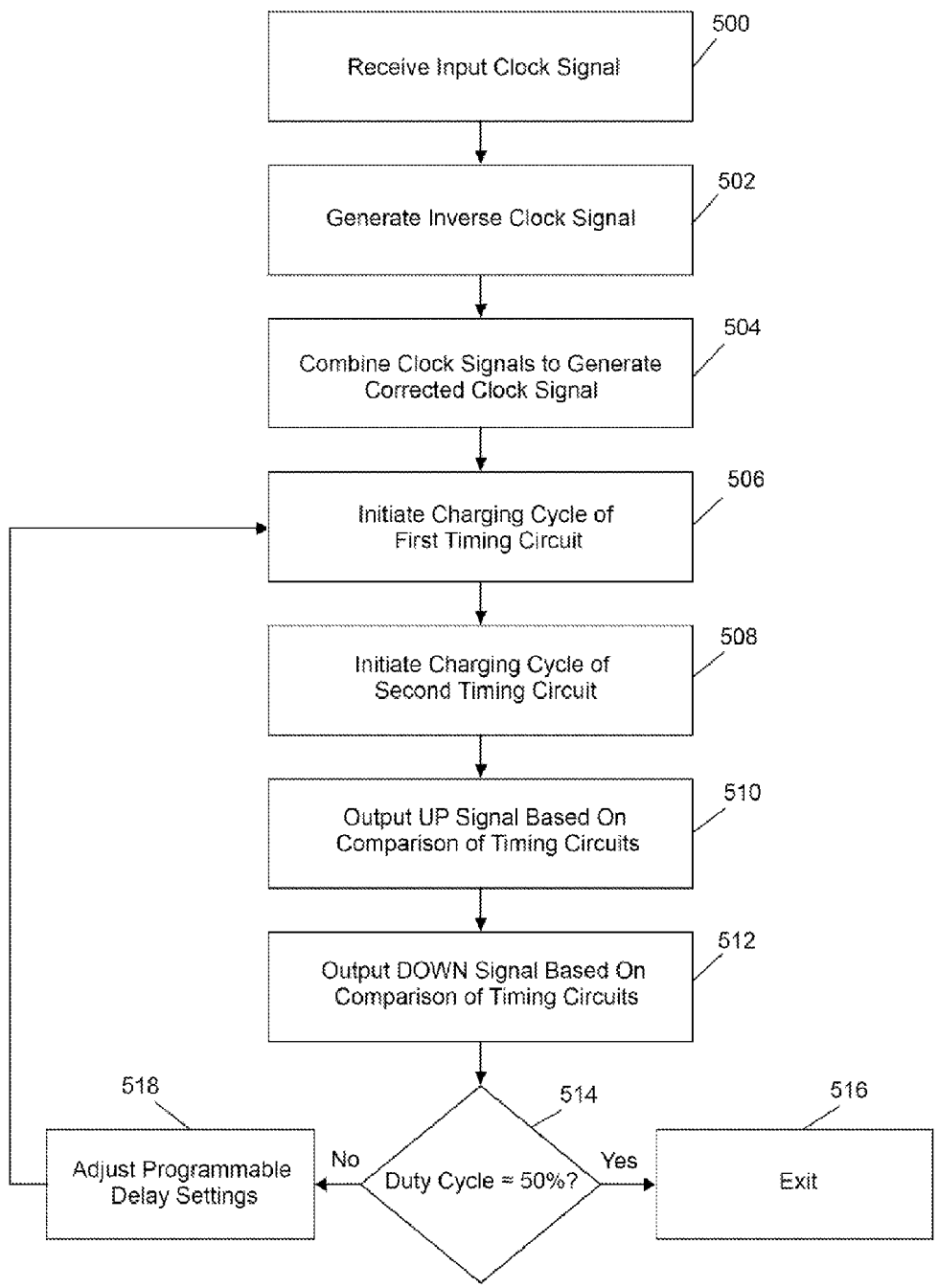
FIG. 5 depicts a flowchart of a routine for operating a duty cycle module, according to an embodiment of the invention.

An exemplary routine regarding the operation of duty cycle module 100 may be described in reference to the flowchart depicted in FIG. 5. Beginning with step 500, duty cycle module 100 may receive PCLK at input node 102. NCLK may be generated in step 502 by inverter 104. PCLK and NCLK are combined by SR latch 110 to generate CCLK in step 504. Feedback to adjust the duty cycle of CCLK may be determined from timing circuits 113 and 121. For example, timing circuit 113 may generate a timing signal corresponding to a high pulse width portion of CCLK by initiating a charging cycle of C 116 at the rising edge of CCLK, as represented by step 506. Correspondingly, timing circuit 121 may generate a timing signal corresponding to a low pulse width portion of CCLK by initiating a charging cycle of C 116 at the rising edge of OCCLK, as represented by step 508. Next, comparator 134 may output the UP signal based upon whether the voltage across C 124 is greater than the voltage across C 116 at a desired time in step 510 and comparator 136 may output the DOWN signal based upon whether the voltage across C 116 is greater than the voltage across C 124 at the desired time in step 512. Operation of comparators 134 and 136 may be controlled by the strobe signal output by duty cycle controller 138, so that timing circuits 113 and 121 are sampled at a desired time. If the UP and DOWN signals indicate the duty cycle of CCLK is sufficiently close to 50%, as represented by step 514, the routine may exit at step 516, leaving programmable delays 106 and 108 at their current settings and CCLK at output node 112 having a duty cycle closer to 50%, such as approximately equal to 50%. Otherwise, duty cycle may determine and apply an adjustment to the settings for programmable delays 106 and 108 in step 518 and the routine may return to step 504 and repeat iteratively until the duty cycle of CCLK reaches a desired condition.

In addition to duty cycle module 100 and its operation to correct the duty cycle of an input clock signal to a value closer to 50%, this disclosure also discloses some embodiments of testing techniques that may be applied to verify operation of duty cycle module 100. Returning to FIG. 1, control lines 140 and 142 couple duty cycle controller 138 to programmable delay 106 and programmable delay 108, respectively. In some embodiments, duty cycle module 100 may also include test module 144 as shown. As will be described below, test module 144 may be configured to apply control words to programmable delays 106 and 108. For example, test module 144 may be coupled to programmable delay 106 by switch 146 to control line 140, disconnecting duty cycle controller 138 and test module 144 may be coupled to programmable delay 108 by switch 148 to control line 142, disconnecting duty cycle controller 138. Accordingly, test module 144 may selectively override duty cycle controller 138. In an embodiment, test module 144 may include a plurality of control words stored in a shift register or other suitable memory element that may be selected and applied to programmable delay 106 or programmable delay 108 in response to an external control signal.

Figure 6:
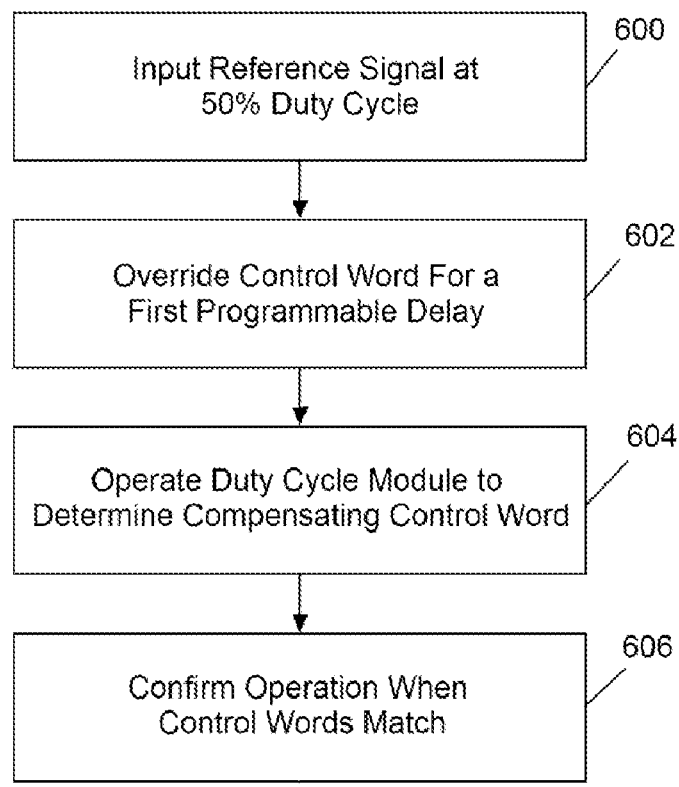
FIG. 6 schematically depicts a flowchart of a routine for verifying the operation of a duty cycle module, according to an embodiment of the invention.

An exemplary routine employing test module 144 to verify the operation of duty cycle module 100 is represented by the flowchart depicted in FIG. 6. Beginning with step 600, a reference signal having a duty cycle known to be approximately equal to 50% may be provided at input node 102. As described above, duty cycle module 100 may be configured to generate a corrected clock signal by selectively delaying either an input clock signal or an inverted clock signal and combining them to generate a corrected clock signal. Duty cycle controller 138 may be configured to apply control words to programmable delays 106 and 108 based on characteristics determined about the duty cycle of the of the corrected clock signal. Therefore, test module 144 may be used to selective override duty cycle controller 138 with regard to one of the programmable delays and apply an external known control word as indicated by step 602. While holding that programmable delay at the external setting, duty cycle module 100 may be allowed to operate as represented by step 604 until the duty cycle of CCLK stabilizes, such as at approximately 50%. During operation, duty cycle controller 138 may determine a control word for the other programmable delay that compensates for the externally applied setting. Specifically, operation of duty cycle module 100 may be verified when the code word output by duty cycle controller 138 is approximately equivalent to the code word applied by test module 144, as indicated by step 606. In a further aspect, additional verification of the proper operation of duty cycle module 100 may include measuring (e.g., with external equipment) the duty cycle generated at output node 112 when stabilized to confirm that the duty cycle has a desired value, such as approximately 50%. One or more of these verification tests may be conducted at various override settings for both programmable delay 106 and programmable delay 108 to check for accurate operation under a range of conditions.

The embodiment illustrated in duty cycle module 100 is provided as a representative example only and should not limit any aspect of other embodiments. Accordingly the embodiments described herein are presently only some embodiments of the invention. However, one skilled in the art that pertains to the present invention will understand that the principles of this disclosure can be extended easily to other embodiments.

What is claimed is:

1. A duty cycle module comprising:
   a first programmable delay to receive an input clock signal and output a first delayed clock signal;
   an inverter to receive the input clock signal and output an inverted clock signal;
   a second programmable delay to receive the inverted clock signal and output a second delayed clock signal;
   a latch to combine the first delayed clock signal and the second delayed clock signal and generate a corrected clock signal;
   a first timing circuit to measure a first pulse width of the corrected clock signal and output a first measurement;
   a second timing circuit to measure a second pulse width of the corrected clock signal and output a second measurement;

a first comparator to output an UP control signal if the first measurement is greater than the second measurement at a desired time;
a second comparator to output a DOWN control signal if the second measurement is greater than the first measurement at the desired time; and
a duty cycle controller to receive at least one of the UP control signal and the DOWN control signal and adjust a setting of one of the first programmable delay and the second programmable delay based on the received at least one control signal in order to adjust a duty cycle of the corrected clock signal.

2. The duty cycle module of claim 1, wherein the duty cycle controller to adjust the duty cycle of the corrected clock signal to approximately fifty percent.

3. The duty cycle module of claim 1, wherein the first timing circuit to initiate a charging cycle of a first capacitor at a time corresponding to the rising edge of the third clock signal.

4. The duty cycle module of claim 3, wherein the second timing circuit to initiate a charging cycle of a second capacitor at a time corresponding to the rising edge of the third clock signal.

5. The duty cycle module of claim 4, wherein the second timing circuit to delay the charging cycle of the second capacitor for a predetermined time.

6. The duty cycle module of claim 4, wherein the first and second timing circuits comprise resistance and capacitance networks to have a time constant wherein one of the first capacitor and the second capacitor is in a charging state and the other of the first capacitor and the second capacitor is in a steady state at the desired time when the duty cycle of the third clock signal is not 50%.

7. The duty cycle module of claim 1, wherein the duty cycle to cause the first comparator to output the UP signal and to cause the second comparator to output the DOWN signal at the desired time.

8. The duty cycle module of claim 1, wherein the duty cycle controller to adjust the setting of one of the first programmable delay and the second programmable delay from a current setting by a unit delay amount.

9. The duty cycle module of claim 1, further comprising a test module to selectively override the duty cycle controller to apply a predetermined delay adjustment to one of the first programmable delay and the second programmable delay.

10. A duty cycle module comprising:
a first programmable delay to delay an input clock signal and output a first delayed signal;
a second programmable delay to delay an inverted input clock signal and output a second delayed signal;
a latch to combine the first delayed clock signal and the second delayed clock signal and generate a corrected clock signal having a duty cycle;
a duty cycle controller to receive information regarding characteristics of the duty cycle of the corrected clock signal and to adjust settings of the first programmable delay and the second programmable delay based on the information; and
a test module to selectively override the duty cycle controller to apply a predetermined delay setting to one of the first programmable delay and the second programmable delay.

11. A method for correcting a clock signal having a duty cycle, comprising:
receiving a first clock signal having a rising edge as an input;
inverting the first clock signal to generate a second clock signal having a rising edge;
combining the first and second clock signals to generate a third clock signal having a rising edge corresponding to the rising edge of the first clock signal, a falling edge corresponding to the rising edge of the second clock signal and a duty cycle;
generating a first timing signal corresponding to a first pulse width of the third clock signal;
generating a second timing signal corresponding to a second pulse width of the third clock signal;
generating a first control signal if the first timing signal is greater than the second timing signal at a first time;
generating a second control signal indicating if the second timing signal is greater than the first timing signal at the first time; and
correcting the duty cycle of the third clock signal by imparting a relative delay to one of the first clock signal and second clock signals based on at least one of the first and second control signals.

12. The method of claim 11, wherein correcting the duty cycle comprises imparting the relative delay to one of the first clock signal and second clock signals so that the third clock signal has a duty cycle of approximately 50%.

13. The method of claim 11, wherein generating the first timing signal comprises initiating a charging cycle of a first capacitor at a time corresponding to the rising edge of the third clock signal.

14. The method of claim 13, wherein generating the second timing signal comprises initiating a charging cycle of a second capacitor at a time corresponding to the falling edge of the third clock signal.

15. The method of claim 14, wherein generating the second timing signal further comprises delaying the initiation of the charging cycle of the second capacitor by a predetermined amount.

16. The method of claim 11, wherein imparting the relative delay to one of the first and second clock signals comprises applying a control setting to programmable delays through which the first and second clock signals are fed.

17. The method of claim 16, wherein imparting the relative delay further comprises adjusting a current setting by a unit delay of the programmable delays.

18. A method for verifying operation of a duty cycle module comprising:
providing a duty cycle module including a first programmable delay to delay an input clock signal, a second programmable delay to delay an inverted input clock signal, and a duty cycle controller, wherein outputs of the first programmable delay and the second programmable delay are combined to generate a corrected clock signal having a duty cycle and wherein the duty cycle controller receives information regarding characteristics of the duty cycle of the corrected clock signal and adjusts settings of the first programmable delay and the second programmable delay based on the information;
inputting a reference clock signal having a duty cycle of 50% as the input clock signal;
selectively overriding the duty cycle controller to apply a predetermined delay setting to one of the first programmable delay and the second programmable delay;
operating the duty cycle correction module to adjust the other programmable delay line until the corrected clock signal has an approximately 50% duty cycle; and
verifying operation of the duty cycle module when the predetermined delay setting applied to the at least one of the first programmable delay and the second programmable delay corresponds to a setting for the other of the first programmable delay and the second programmable delay determined by the duty cycle controller.

19. The method of claim 18, further comprising measuring the duty cycle of the corrected clock signal and verifying operation of the duty cycle module when the measured duty cycle is approximately 50%.

20. The method of claim 18, further comprising performing the overriding of the duty cycle, the operating of the duty cycle module and the verifying operation of the duty cycle module at a plurality of predetermined delay settings.

21. The method of claim 20, wherein verifying operation of the duty cycle module at a plurality of predetermined delay settings includes applying predetermined delay settings to each of the first programmable delay and the second programmable delay.

22. A duty cycle module comprising:
means for delaying an input clock signal to output a first delayed signal;
means for delaying an inverted signal of the input clock signal to output a second delayed signal;
means for combining the first delayed signal and the second delayed signal to generate a corrected clock signal;
a first timing means coupled to the corrected clock signal for measuring a first pulse width of the corrected clock signal and outputting a first measurement;
a second timing means coupled to the corrected clock signal for measuring a second pulse width of the corrected clock signal and outputting a second measurement;
a first comparator means, coupled to the first timing means and the second timing means, for outputting an UP control signal if the first measurement is greater than the second measurement at a desired time;
a second comparator means, coupled to the first timing means and the second timing means, for outputting a DOWN control signal if the second measurement is greater than the first measurement at the desired time; and
means for adjusting a setting of at least one of the means for delaying the input clock signal and the means for delaying the inverted signal based on at least one of the UP control signal and the DOWN control signal to adjust a duty cycle of the corrected clock signal.

23. The duty cycle module of claim 22, wherein the means for adjusting a setting of at least one of the means for delaying the input clock signal and the means for delaying the inverted signal to adjust the duty cycle to approximately 50%.

24. The duty cycle module of claim 22, wherein the first timing means to initiate a measuring cycle at a time corresponding to a rising edge of the corrected clock signal.

25. The duty cycle module of claim 24, wherein the second timing means to initiate a measuring cycle at a time corresponding to a falling edge of the corrected clock signal.

26. The duty cycle module of claim 25, wherein the second timing means to delay initiation of the measuring cycle by a predetermined amount.

27. The duty cycle module of claim 22, wherein the means for adjusting the setting to adjust by a unit delay of the means for delaying.

* * * * *